United States Patent
Vieyra Salas et al.

(10) Patent No.: US 10,509,331 B2
(45) Date of Patent: Dec. 17, 2019

(54) LITHOGRAPHY APPARATUS AND A METHOD OF MANUFACTURING A DEVICE

(71) Applicant: ASML NETHERLANDS B.V., Veldhoven (NL)

(72) Inventors: Jorge Alberto Vieyra Salas, Eindhoven (NL); Auke Juriaan Been, Eindhoven (NL); Victor Manuel Blanco Carballo, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/332,820

(22) PCT Filed: Aug. 30, 2017

(86) PCT No.: PCT/EP2017/071708
§ 371 (c)(1),
(2) Date: Mar. 13, 2019

(87) PCT Pub. No.: WO2018/054658
PCT Pub. Date: Mar. 29, 2018

(65) Prior Publication Data
US 2019/0204758 A1    Jul. 4, 2019

(30) Foreign Application Priority Data
Sep. 20, 2016 (EP) .................... 16189589

(51) Int. Cl.
*G03F 7/20* (2006.01)
(52) U.S. Cl.
CPC ...... *G03F 7/70725* (2013.01); *G03F 7/70341* (2013.01); *G03F 7/70525* (2013.01)
(58) Field of Classification Search
CPC ............ G03F 7/70341; G03F 7/70525; G03F 7/70725
(Continued)

(56) References Cited

U.S. PATENT DOCUMENTS

| 2004/0207824 A1 | 10/2004 | Lof et al. |
| 2007/0109513 A1 | 5/2007 | Leenders et al. |

(Continued)

FOREIGN PATENT DOCUMENTS

| EP | 1420298 | 5/2004 |
| JP | 2007142428 | 6/2007 |

(Continued)

OTHER PUBLICATIONS

International Search Report and Written Opinion issued in corresponding PCT Patent Application No. PCT/EP2017/071708, dated Nov. 29, 2017.

(Continued)

*Primary Examiner* — Hung Nguyen
(74) *Attorney, Agent, or Firm* — Pillsbury Winthrop Shaw Pittman LLP

(57) ABSTRACT

An immersion lithography apparatus having a controller configured to control a positioner to move a support table relative to an immersion space between the support table and a projection system to follow a route having a series of motions, the controller adapted to: predict a speed of an edge of the immersion space relative to an edge of an object on the support table when the edge of the immersion space passes over the edge of the object during at least one motion of the series of motions of the route; compare the speed to a predetermined parameter and to predict liquid loss from the immersion space during the at least one motion if the speed is greater than the predetermined parameter; and if liquid loss from the immersion space is predicted, modify one or more parameters of the route during the at least one motion accordingly.

20 Claims, 5 Drawing Sheets

(58) Field of Classification Search
USPC .................................................... 355/30, 53
See application file for complete search history.

(56) References Cited

U.S. PATENT DOCUMENTS

| | | |
|---|---|---|
| 2007/0188733 A1 | 8/2007 | Ito et al. |
| 2009/0284715 A1 | 11/2009 | Watso et al. |
| 2010/0045949 A1 | 2/2010 | Nakano et al. |
| 2010/0214543 A1* | 8/2010 | Stavenga ............ G03F 7/70341 355/30 |
| 2011/0007286 A1 | 1/2011 | Direcks et al. |
| 2012/0003381 A1* | 1/2012 | Grouwstra .......... G03F 7/70341 427/8 |
| 2012/0069309 A1 | 3/2012 | Willems et al. |
| 2016/0320714 A1 | 11/2016 | Grouwstra et al. |
| 2017/0219933 A1* | 8/2017 | Van Den Nieuwelaar .................. G03F 7/70341 |

FOREIGN PATENT DOCUMENTS

| | | |
|---|---|---|
| TW | 200951635 | 12/2009 |
| TW | 201044117 | 12/2010 |
| TW | 201122731 | 7/2011 |
| TW | 201209524 | 3/2012 |
| TW | 201209526 | 3/2012 |
| WO | 2017054987 | 4/2017 |

OTHER PUBLICATIONS

Taiwanese Office Action issued in corresponding Taiwanese Patent Application No. 106131326, dated Jul. 11, 2018.

* cited by examiner

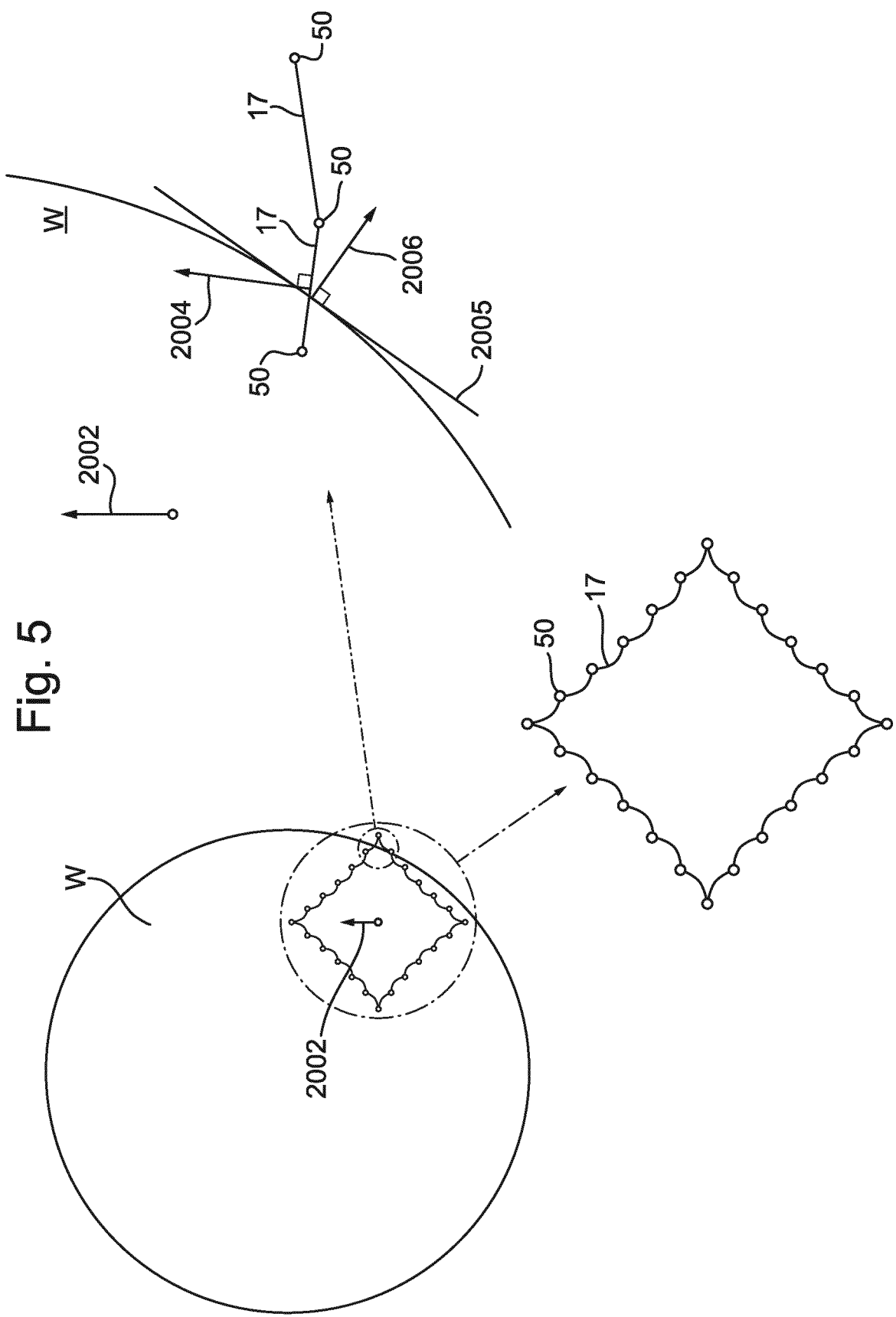

LITHOGRAPHY APPARATUS AND A METHOD OF MANUFACTURING A DEVICE

CROSS-REFERENCE TO RELATED APPLICATIONS

This application is the U.S. national phase entry of PCT patent application no. PCT/EP2017/071708, which was filed on Aug. 30, 2017, which claims the benefit of priority of European patent application no. 16189589.1, which was filed on Sep. 20, 2016, and which is incorporated herein in its entirety by reference.

FIELD

The present invention relates to a lithography apparatus and a method of manufacturing a device using a lithography apparatus.

BACKGROUND

A lithography apparatus is a machine that applies a desired pattern onto a substrate, usually onto a target portion of the substrate. A lithography apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithography apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction.

In an immersion lithography apparatus, a liquid is confined to an immersion space by a liquid confinement structure. The immersion space is between a final optical element of a projection system through which the pattern is imaged and the substrate onto which the pattern is transferred or a substrate table on which the substrate is held. The liquid may be confined to the immersion space by a fluid seal. The liquid confinement structure may create or use a flow of gas, for example to help in controlling the flow and/or the position of the liquid in the immersion space. The flow of gas may help form the seal to confine the liquid to the immersion space.

Defects in the pattern applied to the substrate are undesirable as they reduce the yield, i.e. the number of usable devices per substrate. Because many patterning steps are required to make a device, even a very low rate of defects per exposure can significantly reduce the yield. There are two types of defect that are peculiar to an immersion lithography apparatus.

A droplet of liquid or a liquid film (hereinafter reference to a droplet also encompasses a film; a film being a droplet covering a larger surface area) from the immersion space may be left on the substrate after exposure of a target portion. If the droplet is in contact with the resist for a significant period it can degrade the resist by leaching. If the droplet evaporates, it can leave behind debris and/or may induce a localised cooling. Defects resulting from droplets left on the substrate, whether by resist degradation or evaporation, are referred to herein as trail defects.

A second form of defect peculiar to an immersion lithography apparatus occurs if a bubble is formed in the immersion liquid. If the bubble moves into the path of a projection beam used to project the image of the patterning device onto the substrate, then the projected image will be distorted. Defects caused by bubbles are referred to herein as exposure defects.

Trail defects and exposure defects may cause problems for objects other than the substrate, such as sensors.

SUMMARY

It is desirable, for example, to provide a system to reduce the effects of defects peculiar to an immersion lithography apparatus.

According to an aspect, there is provided an immersion lithography apparatus comprising: a support table configured to support an object having at least one target portion; a projection system configured to project a patterned beam onto the object; a positioner configured to move the support table relative to the projection system; a liquid confinement structure configured to confine a liquid to an immersion space between the projection system and a surface of the object and/or the support table; and a controller configured to control the positioner to move the support table to follow a route comprised of a series of motions, the controller adapted to: predict a speed of an edge of the immersion space relative to an edge of the object when the edge of the immersion space passes over the edge of the object during at least one motion of the series of motions of the route; compare the speed to a predetermined parameter and to predict liquid loss from the immersion space during the at least one motion if the speed is greater than the predetermined parameter; and if liquid loss from the immersion space is predicted, to modify one or more parameters of the route during the at least one motion accordingly.

According to an aspect, there is provided a device manufacturing method using an immersion lithography apparatus to project a patterned beam onto a substrate having a plurality of target portions, the method comprising: confining a liquid to an immersion space between a projection system and a facing surface of an object on a support table and/or the support table using a liquid confinement structure; and moving the support table along a route comprising a series of motions; predicting a speed of an edge of the immersion space relative to an edge of the object when the edge of the immersion space passes over the edge of the object during at least one motion of the series of motions of the route; comparing the speed to a predetermined parameter and to predict liquid loss from the immersion space during the at least one motion if the speed is greater than the predetermined parameter; and if liquid loss from the immersion space is predicted, modifying one or more parameters of the route during the at least one motion accordingly prior to executing the at least one motion.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 is a schematic illustration, in plan, of an edge of the immersion space and an edge of the substrate.

DETAILED DESCRIPTION

Figure 1:
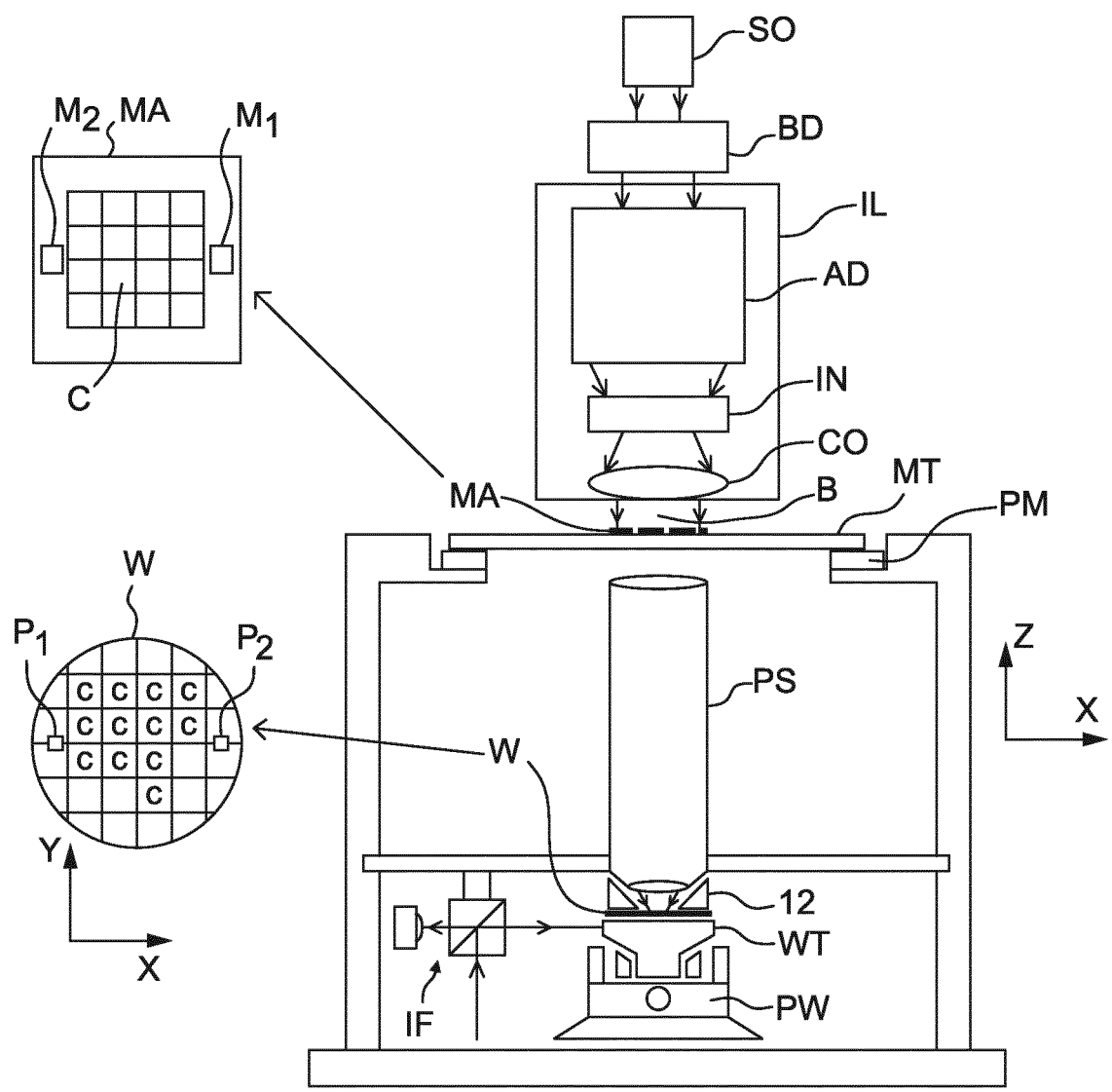
FIG. 1 schematically depicts a lithography apparatus.

FIG. 1 schematically depicts a lithography apparatus according to one embodiment of the invention. The apparatus includes an illumination system (illuminator) ILL configured to condition a projection beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a support table (e.g. a wafer table) WT or "substrate support" or "substrate table" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the projection beam B by patterning device MA onto a target portion C (e.g. including one or more dies) of the substrate W.

The illumination system IL may include various types of optical components, such as refractive components, reflective components, magnetic components, electromagnetic components, electrostatic components or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithography apparatus, and other conditions, such as for example whether or not the patterning device MA is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion C of the substrate W. It should be noted that the pattern imparted to the projection beam B may not exactly correspond to the desired pattern in the target portion C of the substrate W, for example if the pattern includes phase-shifting features or so called assist features. Generally, the pattern imparted to the projection beam B will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithography apparatus may be of a type having two (dual stage) or more stages or tables. At least one of the tables has a substrate support that can hold a substrate. At least one of the tables may be a measurement table that is not configured to hold a substrate. In an embodiment two or more of the tables each have a substrate support. The lithography apparatus may have two or more patterning device tables or "mask supports". In such "multiple stages" machines the additional tables or supports may be used in parallel, or preparatory steps may be carried out on one or more tables or supports while one or more other tables or supports are being used for exposure.

The lithography apparatus is of a type wherein at least a portion of the substrate W may be covered by a liquid having a relatively high refractive index, e.g. water such as ultra pure water (UPW), so as to fill an immersion space between the projection system PS and the substrate W. An immersion liquid may also be applied to other spaces in the lithography apparatus, for example, between the patterning device MA and the projection system PS. Immersion techniques can be used to increase the numerical aperture of projection systems. The term "immersion" as used herein does not mean that a structure, such as a substrate W, must be submerged in liquid; rather "immersion" only means that a liquid is located between the projection system PS and the substrate W during exposure. The path of the patterned radiation beam from the projection system PS to the substrate W is entirely through liquid.

Referring to FIG. 1, the illuminator IL receives a radiation beam from a radiation source SO. The source and the lithography apparatus may be separate entities, for example when the source is an excimer laser. In such cases, the source is not considered to form part of the lithography apparatus. In arrangements where the source is separate from the lithography apparatus, the radiation beam is passed from the source SO to the illuminator IL with the aid of a beam delivery system BD including, for example, suitable directing mirrors and/or a beam expander. In other cases the source may be an integral part of the lithography apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as -outer and -inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithography apparatus. For example, the illuminator IL may be an integral part of the lithography apparatus or may be a separate entity from the lithography apparatus. In the latter case, the lithography apparatus may be configured to allow the illuminator IL to be mounted thereon. Optionally, the illuminator IL is detachable and may be separately provided (for example, by the lithography apparatus manufacturer or another supplier).

The projection beam B is incident on the patterning device MA (e.g., mask), which is held on the support structure MT (e.g., mask table), and is patterned by the patterning device MA. The projection beam having been patterned by the patterning device may be referred to as a patterned beam. Having traversed the patterning device, the projection beam B passes through the projection system PS, which focuses the beam onto a target portion C of the substrate W. With the aid of the second positioning device PW and position sensor IF (e.g. an interferometric device, encoder or capacitive sensor), the substrate table WT can be moved accurately, e.g. so as to position different target portions C in the path of the projection beam B. Similarly, the first positioning device PM and another position sensor (which is not explicitly depicted in FIG. 1) can be used to accurately position the patterning device with respect to the path of the projection beam B, e.g. after mechanical retrieval from a mask library, or during a scan.

In general, movement of the support structure MT may be realized with the aid of a long-stroke module (coarse positioning) and a short-stroke module (fine positioning), which form part of the first positioning device PM. Similarly, movement of the support table WT or "substrate support" may be realized using a long-stroke module and a short-stroke module, which form part of the second positioning device PW.

The patterning device and substrate W may be aligned using patterning device alignment marks M1, M2 and substrate alignment marks P1, P2. Although the substrate alignment marks P1, P2 as illustrated occupy dedicated target portions, they may be located in spaces between target portions (these are known as scribe-lane alignment marks). Similarly, in situations in which more than one die is provided on the patterning device, the patterning device alignment marks may be located between the dies.

The lithographic apparatus further includes a lithographic apparatus control unit 500 which controls all the movements and measurements of the various actuators and sensors described. The lithographic apparatus control unit 500 also includes signal processing and data processing capacity to implement desired calculations relevant to the operation of the lithographic apparatus. In practice, the lithographic apparatus control unit 500 will be realized as a system of many sub-units, each handling the real-time data acquisition, processing and control of a subsystem or component within the lithographic apparatus. For example, one processing subsystem may be dedicated to servo control of the second positioning device PW. Separate units may handle different actuators, or different axes. Another sub-unit might be dedicated to the readout of the position sensor IF. Overall control of the lithographic apparatus may be controlled by a central processing unit. The central processing unit may communicate with the sub-units, with operators and with other apparatuses involved in the lithographic manufacturing process.

Arrangements for providing liquid between a final optical element of the projection system PS and the substrate can be classed into three general categories. These are the bath type arrangement, the so-called localized immersion systems and the all-wet immersion systems. An embodiment of the present invention relates particularly to the localized immersion systems.

Figure 2:
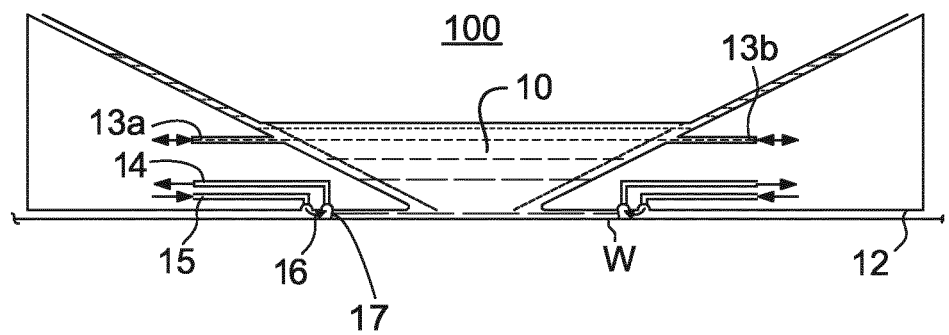
FIG. 2 schematically depicts a liquid confinement structure for use in a lithographic projection apparatus.

In an arrangement which has been proposed for a localized immersion system a liquid confinement structure 12 extends along at least a part of a boundary of an immersion space 10 between the final optical element 100 of the projection system PS and the facing surface of the stage or table facing the projection system PS. The facing surface of the table is referred to as such because the table is moved during use and is rarely stationary. Generally, the facing surface of the table is a surface of a substrate W, support table WT, e.g. the substrate table which surrounds the substrate W or both. Such an arrangement is illustrated in FIG. 2. The arrangement illustrated in FIG. 2 and described below may be applied to the lithography apparatus described above and illustrated in FIG. 1.

FIG. 2 schematically depicts the liquid confinement structure 12. The liquid confinement structure 12 extends along at least a part of a boundary of the immersion space 10 between the final optical element 100 of the projection system PS and the support table WT or substrate W. In an embodiment, a seal is formed between the liquid confinement structure 12 and the surface of the substrate W/support table WT. The seal may be a contactless seal such as a gas seal 16 (such a system with a gas seal is disclosed in European patent application publication no. EP-A-1,420, 298) or a liquid seal.

The liquid confinement structure 12 is configured to supply and confine immersion liquid to the immersion space 10. Immersion liquid is brought into the immersion space 10 through one of liquid openings 13, e.g., opening 13a. The immersion liquid may be removed through one of liquid openings 13, e.g., opening 13b. The immersion liquid may be brought into the immersion space 10 through at least two liquid openings 13, e.g., opening 13a and opening 13b. Which of liquid openings 13 is used to supply immersion liquid and optionally which is used to remove immersion liquid may depend on the direction of motion of the support table WT.

Immersion liquid may be contained in the immersion space 10 by the gas seal 16 which, during use, is formed between the bottom of the liquid confinement structure 12 and the facing surface of the table (i.e. the surface of the substrate W and/or the surface of the support table WT). The gas in the gas seal 16 is provided under pressure via gas inlet 15 to a gap between the liquid confinement structure 12 and substrate W and/or support table WT. The gas is extracted via a channel associated with gas outlet 14. The overpressure on the gas inlet 15, vacuum level on the gas outlet 14 and geometry of the gap are arranged so that there is a high-velocity gas flow inwardly that confines the liquid. The force of the gas on the liquid between the liquid confinement structure 12 and the substrate W and/or support table WT contains the liquid in the immersion space 10. A meniscus 17 forms at a boundary of the immersion liquid. Such a system is disclosed in United States patent application publication no. US 2004-0207824. Other liquid confinement structures 12 can be used with embodiments of the present invention.

Figure 3:
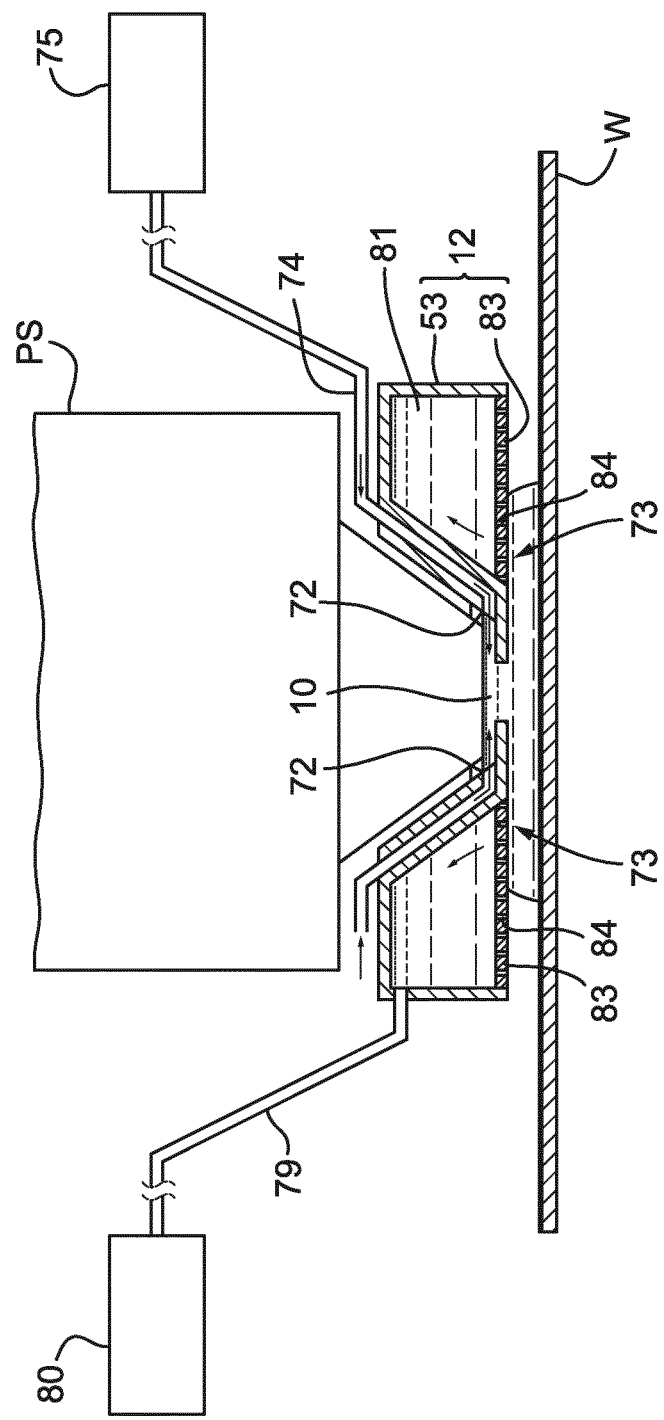
FIG. 3 is a side cross sectional view that schematically depicts a further liquid supply system according to an embodiment.

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a liquid confinement structure 12, which extends along at least a part of a boundary of the space between the final element of the projection system PS and the support table WT or substrate W. (Reference in the following text to surface of the substrate W also refers in addition or in the alternative to a surface of the support table WT, unless expressly stated otherwise.)

The liquid confinement structure 12 at least partly contains liquid in the immersion space 10 between the final element of the projection system PS and the substrate W and/or support table WT. The space 10 is at least partly formed by the liquid confinement structure 12 positioned below and surrounding the final element of the projection system PS. In an embodiment, the liquid confinement structure 12 comprises a main body member 53 and a porous member 83. The porous member 83 is plate shaped and has a plurality of holes 84 (i.e., openings or pores). In an embodiment, the porous member 83 is a mesh plate wherein numerous small holes 84 are formed in a mesh. Such a system is disclosed in United States patent application publication no. US 2010/0045949 A1.

The main body member 53 comprises one or more supply ports 72, which are capable of supplying the liquid to the immersion space 10, and a recovery port 73, which is capable of recovering the liquid from the immersion space 10. The one or more supply ports 72 are connected to a liquid supply apparatus 75 via a passageway 74. The liquid supply apparatus 75 is capable of supplying the liquid to the one or more supply ports 72. The liquid that is fed from the liquid supply apparatus 75 is supplied to the one or more supply ports 72 through the corresponding passageway 74. The one or more supply ports 72 are disposed in the vicinity of the optical path at a respective prescribed position of the main body member 53 that faces the optical path. The recovery port 73 is capable of recovering the liquid from the immersion space 10. The recovery port 73 is connected to a liquid recovery apparatus 80 via a passageway 79. The liquid recovery apparatus 80 comprises a vacuum system and is capable of recovering the liquid by sucking it via the recovery port 73. The liquid recovery apparatus 80 recovers the liquid recovered via the recovery port 73 through the passageway 79. The porous member 83 is disposed in the recovery port 73.

In an embodiment, to form the immersion space 10 with the liquid between the projection system PS and the liquid confinement structure 12 on one side and the substrate W on the other side, liquid is supplied from the one or more supply ports 72 to the immersion space 10 and the pressure in a recovery chamber 81 in the liquid confinement structure 12 is adjusted to a negative pressure so as to recover the liquid via the holes 84 (i.e., the recovery port 73) of the porous member 83. Performing the liquid supply operation using the one or more supply ports 72 and the liquid recovery operation using the porous member 83 forms the immersion space 10 between the projection system PS and the liquid confinement structure 12 and the substrate W.

In order to reduce or minimize the cost of ownership of a lithography apparatus, it is desirable to maximize throughput and yield. Throughput is the rate at which substrates are exposed. Yield is the proportion of devices formed on substrates by exposure in an immersion lithographic tool that function correctly. Because many exposure steps may be required to create a device, even a low rate of defects per exposure may result in a significant reduction of yield.

The frequency of occurrence of both trail defects and exposure defects tends to increase as the speed of relative motion between the support table WT and the liquid confinement structure 12 increases. The speed of relative motion during a scanned exposure is referred to as the scan speed. An increase in the scan speed is desirable to increase throughput. An increase in scan speed may lead to an increase in defects because it is more difficult effectively to confine the immersion liquid to the immersion space 10. With increased speed there is an increased risk of instability in the meniscus between the immersion hood and facing surface. Trail defects and exposure defects tend not to be randomly or uniformly distributed across the area of exposed substrates but occur with higher probability in certain locations. The distribution of trail defects and exposure defects may vary according to the exposure recipe, in particular according to the order of exposure of target portions (i.e. the route comprised of a series of motions which the support table WT follows). To reduce the occurrence of defects, the scan speed may be reduced when exposing certain target portions of a substrate W. However a reduction of scan speed is undesirable as it reduces throughput.

It should be noted that in a lithography apparatus it is normally the support table WT that moves while the projection system PS and liquid confinement structure 12 are stationary. However it is often convenient to describe motions of the support table WT as if the support table WT is stationary and the projection system PS and liquid confinement structure 12 move. An embodiment of the invention applies whether the support table WT and/or the projection system PS/liquid confinement structure 12 move.

The lithography apparatus may be provided with measures to prevent the formation of bubbles, to prevent bubbles straying into the path of the projection beam or to remove bubbles from the immersion space 10. Such measures may not be wholly effective. A bubble will in time be removed from the immersion space 10 with the flow of liquid out of the immersion space; or the gas within the bubble may dissolve into the immersion liquid so that the bubble disappears. However such a bubble may still stray into the projection beam during an exposure and cause a defect. The defect may occur at an unpredictable location in any of the first few target portions that are exposed after formation of the bubble, i.e. entrance of the bubble into the immersion space. It is therefore difficult to determine the cause of an exposure defect; in particular it can be difficult to determine when a bubble that caused a particular exposure defect was created.

To expose a series of target portions, a route comprised of a series of motions is typically calculated in advance. The route may be based on a meandering motion over the surface of the support table WT along successive fields in sequential rows across the substrate W surface. It includes scanning motions of the support table WT for each target portion to be exposed and transfer motions between scanning motions to line up the support table WT for the next scanning motion. Conventionally, each target portion in a column of target portions extending in a non-scan direction, e.g. the X direction, is exposed in turn. During the exposure, the support table WT moves in a scan direction, e.g. the +Y direction, which is substantially perpendicular to the non-scan direction, or a reverse scan direction, e.g. the −Y direction. Exposures in a sequence alternate between the scan direction and the reverse scan direction. The exposure motions and the transfer motions therefore together form the route. The route may also include motions to perform measurements before, during, or after a sequence of exposures. During a route, the substrate W may move partly or completely out from underneath the liquid confinement structure 12 so that the immersion liquid does not overlap the substrate W. This occurs in particular when exposing an edge target portion, i.e. of a field which is adjacent to or overlaps the edge of the substrate W.

In an embodiment, the liquid confinement structure 12 is configured to confine the immersion liquid to the immersion space 10 which has a cornered shape in plan, i.e. substantially parallel to the facing surface. The meniscus 17 of the immersion space has the cornered shape. The cornered shape may be, for example, generally diamond-shaped with rounded corners. The sides may be slightly concave. The corners point in the scan (Y) and non-scan (X) directions so that the principal axes of the cornered shape are substantially orthogonal and respectively substantially parallel to the scan and non-scan directions. The major movements of the support table WT are in the scan and non-scan directions. The wet area corresponding to the interface between the immersion space and the facing surface is sometimes referred to as a 'footprint'. In an embodiment as described, the liquid confinement structure 12 in operation has a footprint having a cornered shape. In another embodiment, the footprint has no corners and it may be substantially elliptical or circular, for example, but the footprint can be any shape.

The below description will be given with reference to the immersion space 10 moving over an edge of a substrate W. However, the present invention is equally applicable to cases where the immersion space 10 passes over other objects on the support table WT, for example over a sensor, such as a sensor edge. The invention is applicable to any type of liquid confinement structure 12 irrespective of how the liquid is confined to the footprint. For example the invention is applicable to a liquid confinement structure 12 without a flow of gas out of the liquid confinement structure 12 to help confine liquid and also to a liquid confinement structure 12 with a two dimensional array of openings for the extraction of liquid and/or gas (e.g. extraction through a porous member).

It has been found that during execution of a route when an edge of a substrate W on the support table WT moves under the edge of the immersion space 10 defined by the meniscus 17, immersion liquid loss from the immersion space 10 is most likely to occur. The liquid left behind can lead to trail defects or exposure defects. For example, if the liquid is left behind in a single position on the substrate W, this can lead to leaching defects. Additionally or alternatively if the liquid is left behind too long at a single position. The remaining liquid can evaporate leading to a deleterious cooling load at that position. Additionally or alternatively, if a subsequent motion of the route results in the meniscus 17 colliding with leaked liquid left behind from a previous motion, this can result in bubble formation in the immersion space 10. Such bubble formation can result in exposure defects.

Reducing the speed of the motion when the edge of the immersion space 10 passes over the edge of the substrate W, reduces the chance of liquid loss from the immersion space 10. However, such a system may not optimise throughput because certain motions over an edge, which would not have led to liquid loss, are unnecessarily performed at reduced speed. End users may have different requirements. Some end users may prefer a reduction in through put in exchange for lower defectivity; whereas other customers may require higher through put at the expense of more defects.

The present inventors have established that there is an experimentally measurable relative speed of an edge of the immersion space 10 relative to an edge of the substrate W above which liquid loss from the immersion space will occur and below no liquid loss from the immersion space 10 will occur. This experimentally measured parameter depends on many variables including, but not limited to: the type of liquid confinement structure 12 used and the parameters under which it operates (for example fluid flow speeds, fluid volume flow rate and distance between the bottom surface of the liquid confinement structure 12 and the substrate W), as well as features of the substrate W such as the roundness of the edge, the substrate W edge bevel, local temperature variations, the way in which the edge of any photoresist on the substrate W has been treated (a so called edge bead removal strategy), the type of photoresist used and the static receding contact angle of the immersion liquid on the top surface of the substrate W.

Figure 4:
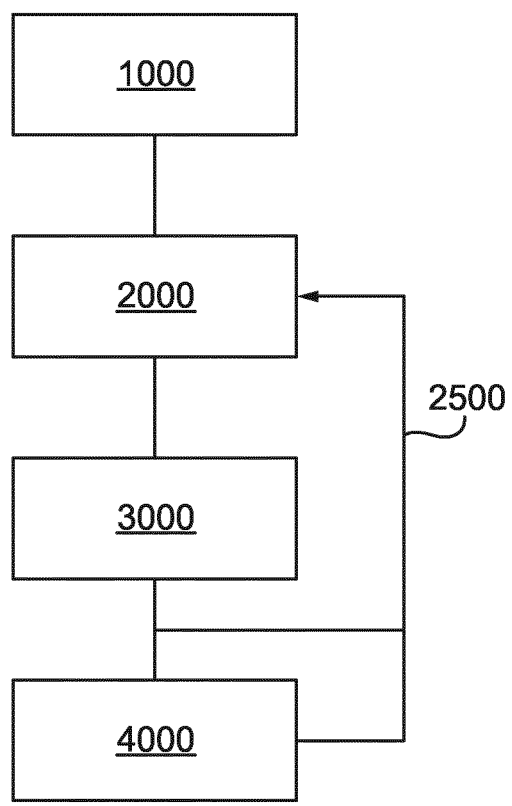
FIG. 4 is a flow diagram of the program followed by the controller.

FIG. 4 is a flow diagram illustrating how the lithographic apparatus control unit 500 controls the positioner PW of the support table WT using the above insight. The flow diagram of FIG. 4 suggests that a process is followed step by step. However, this may not be the case, but is described in this way below to aid understanding. In an embodiment all the steps in the loop 2000-4000 are calculated simultaneously, for example using matrix operations. This embodiment may be preferred as the calculations can be performed faster. This embodiment may be most suited to the case where the process is performed during implementation of the route (described below).

Details of the desired route are sent to the lithographic apparatus control unit 500 at step 1000. The information regarding the route includes information regarding the location of the immersion space 10 relative to the object at the start of a motion, the location of the immersion space 10 relative to the object at the end of a motion and the speed of movement and direction between the location at the start of the motion and the location at the end of the motion. The lithographic apparatus control unit 500 proceeds to step 2000 for a motion of the route in which an edge of the immersion space 10 passes over an edge of the object. The lithographic apparatus control unit 500 determines in step 2000 a speed of the edge of the immersion space 10 relative to the edge of the object. In step 3000 the lithographic apparatus control unit 500 predicts if the motion is likely to result in liquid loss. The lithographic apparatus control unit 500 does this by comparing the speed determined in step 2000 to a predetermined parameter. If the speed determined in step 2000 is greater than the predetermined parameter, a prediction of liquid loss is made.

In an embodiment, the predetermined parameter is representative of a speed. The predetermined parameter may be a speed experimentally determined at which liquid loss from the immersion space 10 occurs.

In step 4000, for those motions where liquid loss is predicted in step 3000, one or more parameters of the route during the at least one motion for which liquid loss has been predicted can be modified. The modification may reduce the amount of liquid lost during the motion, or may attempt substantially to avoid any liquid loss.

After step 4000, the lithographic apparatus control unit 500 may return via loop 2500 to step 2000. In an embodiment the lithographic apparatus control unit 500 may, or may not, repeat steps 2000 and 3000 (and optionally 4000) on the motion which the lithographic apparatus control unit 500 has just modified. The repetition may be performed in order to check whether or not it is appropriate to avoid or reduce the predicted water loss even further. This can be seen as a check to see whether the modifications made in step 4000 are effective to achieve the desired reduction in liquid loss from the immersion space 10.

The predetermined parameter may be experimentally determined. For example, the predetermined parameter may be a speed of an edge of the immersion space 10 in a direction normal to the edge of the object above which liquid is found to escape from the liquid confinement structure 12 when the edge of the immersion space passes over the edge of the object. The predetermined parameter may be determined by moving the edge of a test object under the edge of the immersion space 10 at a plurality of different speeds of the edge of the immersion space 10 in a direction normal to the edge of the object. The predetermined parameter may then be set to be a value between a speed at which substantially no liquid is lost from the immersion space 10 and a speed at which liquid is lost from the immersion space 10. In an alternative embodiment the predetermined parameter may be the minimum speed at which a meniscus of liquid extending between a surface of the liquid confinement structure 12 and a surface of the substrate W in the immersion space 10 is unstable at the edge of the test object.

In an embodiment the predetermined parameter may not be experimentally determined. For example, an operator may select an arbitrary predetermined parameter. The operator may then decide on the basis of the through put achieved and the defectivity rate whether to increase or decrease the predetermined parameter. An increase in the predetermined parameter would result in higher through put but may well result in higher defectivity as well. A reduction in the magnitude of the predetermined parameter would mean that more motions of the series of motions of the route have a reduced speed meaning lower through put but likely a lower defectivity rate.

If a particular motion has a predicted speed of the edge of the immersion space 10 relative to the edge of the object greater than the predetermined parameter, this results in a prediction of liquid loss from the immersion space 10. The control program may modify one or more parameters of the route during the motion for which liquid loss is predicted. The modification to the one or more parameters of the route is one which will make liquid loss less likely. For example, one or more or in any combination of the following parameters may be modified for the motion for which leaking is predicted: reducing a speed of the at least one motion of the route; reducing the distance between the liquid confinement structure 12 and support table WT during the at least one motion of the route; increasing a fluid flow rate into or out of the liquid confinement structure 12 during the at least one motion of the route; and increasing a rate of a change in direction of the support table WT during the at least one motion. By selecting a different rate of change in direction for a motion, the path would have a different radius. Each of those parameters is likely to reduce the chance of liquid loss from the immersion space 10 during the motion for which liquid loss is predicted. In an embodiment, if leaking of liquid is predicted, the lithographic apparatus control unit 500 reduces the speed of the motion which leads to liquid loss to the predetermined parameter or lower.

The inventors have found that the relative speed above which liquid loss from the immersion space 10 occurs is also dependent upon the relative orientations of the edges of the immersion space 10 and substrate W. In an embodiment the lithographic apparatus control unit 500 determines the speed of the edge of the immersion space 10 in a direction normal to the edge of the substrate W during the at least one motion. This speed gives an even more accurate determination of whether or not liquid is likely to leak from the immersion space 10 during the motion.

In order to determine the speed of the edge of the immersion space 10 in a direction normal to the edge of the substrate W during the at least one motion, the lithographic apparatus control unit 500 is provided with geometrical information regarding the likely shape, in plan, of the immersion space 10. In addition, the lithographic apparatus control unit 500 is provided with data relating to the shape of the edge of the substrate W. In an embodiment in step 2000 the edge of the immersion space 10 is treated as a plurality of discrete immersion space edge portions. The edge of the substrate W may be treated in the same way, namely as a plurality of discrete object edge portions.

The lithographic apparatus control unit 500 determines the speed of the discrete immersion space edge portions in a direction normal to the edge of the discrete object edge portions over which the discrete immersion space edge portion passes. The determined speeds can be termed discrete immersion space edge portion speeds. Each of the discrete immersion space edge portion speeds calculated for a particular motion is then compared in step 3000 to the predetermined parameter. In an embodiment, if any of the discrete immersion space edge portion speeds for a given motion are greater than the predetermined parameter, the lithographic apparatus control unit 500 moves to step 4000. If the comparison step 3000 shows that the predicted discrete immersion space edge portion speeds are not greater than the predetermined parameter, the lithographic apparatus control unit 500 returns via loop 2500 back to step 2000 to predict the discrete immersion space edge portion speeds for the next motion of the series of motions of the route. In an alternative embodiment, only if more than a certain number of the discrete immersion space edge portion speeds exceed the predetermined parameter, does the lithographic apparatus control unit 500 progress to step 4000.

After modifying the one or more parameters of the route in step 4000, the lithographic apparatus control unit 500 returns via loop 2500 to step 2000 to predict the immersion space edge portion speeds for the next motion of the series of motions of the route.

The discretising of the edge of the immersion space as plurality of discrete immersion space edge portion is also a convenient way for the lithographic apparatus control unit 500 to determine whether or not an edge of the immersion space 10 passes over the edge of a substrate W. For example, if one or both ends of one of the immersion space edge portions passes over an object edge portion during the motion of the route, the lithographic apparatus control unit 500 determines that an edge of the immersion space 10 passes over the edge or the substrate W. In an embodiment only if it is determined that an edge of the immersion space 10 passes over the edge of the substrate W, is the speed of the edge of the immersion space 10 relative to the edge of the substrate W predicted.

In an embodiment, as for example illustrated in FIG. 5, the liquid confinement structure 12 comprises a plurality of extraction openings 50 in a bottom surface (i.e. a surface facing the surface of the substrate W). The openings 50 are for the extraction of gas from outside of the immersion space 10 and/or extraction of an immersion liquid from inside the immersion space 10. The meniscus 17 of the immersion liquid extends between adjacent openings 50. It is convenient to discretise the edge of the immersion space 10 into the plurality of the discrete immersion space edge portions by assigning the discrete immersion space edge portions as extending between one or more sequential openings 50, for example between adjacent openings 50.

As illustrated in FIG. 5, in an embodiment the lithographic apparatus control unit 500 calculates a normal direction of the discrete immersion space edge portion. A motion direction of the liquid confinement structure 12 is illustrated by arrow to 2002. For the immersion space edge portion magnified in the Figure a normal direction 2004 can be calculated. In the same way a normal direction 2006 of the object edge portion (perpendicular to the tangent 2005 to the object edge portion) is calculated.

Figure 6:
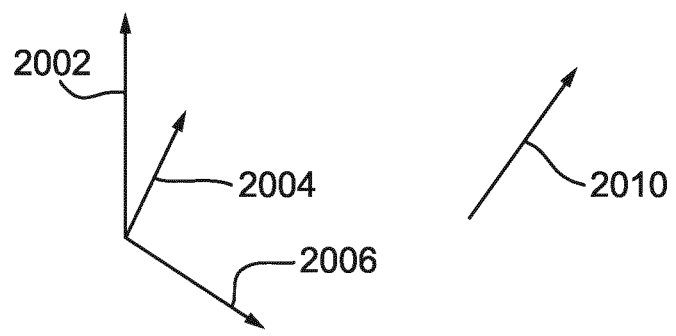
FIG. 6 illustrates vector analysis performed in an embodiment by the controller.

The meniscus 17 experiences a force on it in the direction of its normal 2004 due to the motion 2002 of the substrate W relative to the liquid confinement structure 12. The local velocity experienced by the meniscus 17 relative to the substrate W is then calculated by resolving the velocity of the liquid confinement structure 12 relative to the substrate W in the normal direction 2004 of the meniscus 17. The component of the local velocity in the direction of the normal 2006 to the object edge portion is then calculated. This component is referred to as the contact line speed and is compared to the predetermined parameter. Thereby a speed of an edge of the immersion space relative to an edge of the object is calculated. Vector analysis may be used to calculate this speed. Thus a relative velocity of the two normal directions 2004, 2006 due to the at least one motion is calculated and its magnitude compared to the predetermined parameter. The two normal directions 2004, 2006 and the at least one motion 2002 are illustrated in FIG. 6. A resulting vector 2010 representative of the relative velocity of the normal to the discrete immersion space edge portion in a direction normal to the discrete object edge portion is calculated. In an embodiment, the magnitude of the relative velocity is taken as the speed which is then compared in step 3000 to the predetermined parameter.

In an embodiment, a ratio of the speed which is compared to the predetermined parameter to the predetermined parameter is calculated. In an embodiment, this is the ratio by which the speed of the motion of the liquid confinement structure 12 is reduced in order to calculate a speed to avoid liquid loss. In an embodiment, the lithographic apparatus control unit 500 reduces the speed of the motion for which loss of liquid is predicted by the ratio. In the case that more than one discrete object edge portion is found to leak liquid for a given motion, a reduced speed of the motion of the liquid confinement structure 12 can be selected in one of a number of different claims. One way to select a speed would be to select a lowest of the calculated speeds to avoid liquid loss. Another way to select a speed would be to select a speed equal to the median, mean, minimum, maximum, weighted average, weighted mean or a certain percentile (e.g. bottom 10%) of the calculated speeds to avoid liquid loss.

In an embodiment, the lithographic apparatus control unit 500 makes further a calculation after step 3000 before deciding whether or not to continue on to step 4000 if liquid loss is predicted in step 3000. For example, the lithographic apparatus control unit 500 may decide that the position of leaked liquid, the amount of leaked liquid and/or the time leaked liquid spends at one location results in a low risk of any defects arising as a result of the immersion liquid loss. If a low risk of defect is determined, the risk of liquid loss may be accepted and the lithographic apparatus control unit 500 returns to step 2000 without modifying one or more parameters of the route in step 4000. Therefore a step of determining whether or not it is appropriate to avoid or reduce the predicted liquid loss may be carried out after step 3000 before preceding onto step 4000. If it is determined that it is not appropriate to avoid the predicted water loss, the lithographic apparatus control unit 500 takes loop 2500 without proceeding to step 4000. If it is determined that it is appropriate to reduce predicted water loss, the lithographic apparatus control unit 500 proceeds to step 4000.

In an embodiment the lithographic apparatus control unit 500 forecasts any movement of liquid from the liquid loss on the substrate W during subsequent motions of the route. For example, leaking of liquid can be predicted to occur throughout the motion or until the liquid confinement structure 12 changes direction (by more than a certain minimum amount). The interaction of that leaked liquid with the liquid confinement structure 12 can also be predicted. Liquid which is left behind on the substrate W may be absorbed into the immersion space 11 when the liquid confinement structure 12 passes over the liquid. On the other hand, the leaked liquid may be pushed in front of the liquid confinement structure 12 (sometimes termed bulldozing), for example by a radially outer gas knife component of the liquid confinement structure 12. The liquid may work its way around the outside of the liquid confinement structure 12 and be left behind the liquid confinement structure 12 on the substrate W as a trail of droplets. A trail of droplets is also left behind from the initial leaking (termed trailing droplets). The simulation accounts for both types of droplet as well as absorbed liquid and bulldozed droplets can later become trailing droplets, for example. The movement of liquid may be the result of interaction of the liquid with the liquid confinement structure 12 during a subsequent motion. For example, it is determined whether the liquid which remains on the substrate W is in the path of the immersion space 10 for one or more subsequent motions. The lithographic apparatus control unit 500 may then determine the amount of time which the liquid of the loss liquid spends in one particular place on the substrate W. If the time that the liquid of the loss liquid spends in one position on the substrate W is determined to be greater than a predetermined leach limit or predetermined evaporation limit, it can be determined that the liquid loss should be avoided or reduced. The predetermined leach limit can be seen as a time above which leach defects can be expected. The predetermined evaporation limit can be seen as a time above which trail defects or localised cooling defects resulting from evaporation (e.g. particulate matter or localised cooling) can be expected. The predetermined leach limit and predetermined evaporation limit may be experimentally determined by carrying out experiments to determine after what time periods leach defects occur or when evaporation defects occur. Alternatively or additionally those parameters can be selected based on experience.

In an embodiment the lithographic apparatus control unit 500 may make an estimate of the quantity of the liquid loss expected during the at least one motion. If the quality of liquid lost is greater than a predetermined quantity, the controller 500 may determine that it is appropriate to avoid or reduce liquid loss. In an embodiment an estimate of the quantity of the liquid loss can be made on the basis of the difference between the normal directions 2004, 2006. For example, if the angle between the normal directions 2004, 2006 is smaller, this may be indicative of a larger liquid loss.

If the forecasting determines that liquid from the liquid loss remains on the object and/or the support table at the end of the route at a position and/or in a quantity contrary to a predetermined set of rules, then the controller 500 may determine that it is appropriate to avoid or reduce liquid loss.

The lithographic apparatus control unit 500 may perform the above described process (e.g. predict, compare and modify) during the implementation of the route. That is, the lithographic apparatus control unit 500 may perform steps 2000-4000 whilst the liquid confinement structure 12 is already following the route. In an alternative embodiment the lithographic apparatus control unit 500 may perform steps 2000-4000 on the route off line, prior to the modified route being executed by the immersion apparatus.

In an embodiment, instructions to calculate or perform the route may take the form of a computer program containing one or more sequences of machine-readable instructions describing a method as disclosed above, or a data storage medium (e.g. semiconductor memory, magnetic or optical disk) having such a computer program stored therein. The computer program can be applied as an upgrade to an existing lithography apparatus.

In an embodiment, there is provided an immersion lithography apparatus comprising: a support table configured to support an object having at least one target portion; a projection system configured to project a patterned beam onto the object; a positioner configured to move the support table relative to the projection system; a liquid confinement structure configured to confine a liquid to an immersion space between the projection system and a surface of the object and/or the support table; and a controller configured to control the positioner to move the support table to follow a route comprised of a series of motions, the controller adapted to: predict a speed of an edge of the immersion space relative to an edge of the object when the edge of the immersion space passes over the edge of the object during at least one motion of the series of motions of the route; compare the speed to a predetermined parameter and to predict liquid loss from the immersion space during the at least one motion if the speed is greater than the predetermined parameter; and if liquid loss from the immersion space is predicted, modify one or more parameters of the route during the at least one motion accordingly.

In an embodiment, the controller is configured such that the predicting the speed comprises determining the speed of the velocity of the edge of the immersion space in a direction normal to the edge of the object during the at least one motion. In an embodiment, the controller is configured such that the predicting the speed comprises treating the edge of the immersion space as a plurality of discrete immersion space edge portions and treating the edge of the object as a plurality of discrete object edge portions and calculating the speed for each immersion space edge portion. In an embodiment, the controller is configured such that the predicting the speed further comprises determining that the edge of the immersion space passes over the edge of the object if one or both ends of one of the immersion space edge portions passes over an object edge portion during the one motion of the route. In an embodiment, the controller is configured such that the predicting the speed further comprises determining a normal direction of at least one of the immersion space edge portions and a normal direction of the object edge portion over which the at least one of the immersion space edge portions passes, and calculating a relative velocity of the two normal directions due to the at least one motion of the route, wherein a magnitude of the relative velocity is taken as the speed. In an embodiment, the liquid confinement structure comprises a plurality of extraction openings in a surface facing the surface of the object and/or the support table, the extraction openings being for the extraction of immersion liquid from the immersion space and/or for the extraction of gas from outside of the immersion space, each of the plurality of discrete immersion space edge portions corresponding to one or more sequential extraction openings. In an embodiment, the controller is configured such that the predicting the speed treats the discrete immersion space edge portions as portions extending between adjacent extraction openings. In an embodiment, the controller is configured such that the modifying one or more parameters includes one or more selected from: reducing a speed of the at least one motion of the route; reducing the distance between the liquid confinement structure and support table during the at least one motion of the route; increasing a fluid flow rate into or out of the liquid confinement structure during the at least one motion of the route; and/or increasing a rate of change in direction of the support table during the at least one motion. In an embodiment, the controller is configured such that the speed is reduced to the predetermined parameter or lower. In an embodiment, the controller is further configured to modify the one or more parameters only if it is determined that it is appropriate to avoid or reduce the predicted liquid loss. In an embodiment, the controller is configured such that the determining whether it is appropriate comprises forecasting any movement of liquid from said liquid loss on the object during the route subsequent and/or prior to the at least one motion. In an embodiment, the controller is configured such that the determining whether it is appropriate comprises forecasting the presence of liquid lost in the at least one motion in the path of the immersion space in a subsequent motion to the at least one motion. In an embodiment, the controller is adapted to determine that it is appropriate to avoid or reduce the liquid loss if the forecasting determines that liquid from the liquid loss remains on the object and/or the support table at the end of the route at a position and/or in a quantity contrary to a predetermined set of rules.

In an embodiment, there is provided a device manufacturing method using an immersion lithography apparatus to project a patterned beam onto a substrate having a plurality of target portions, the method comprising: confining a liquid to an immersion space between a projection system and a facing surface of an object on a support table and/or the support table using a liquid confinement structure; moving the support table along a route comprising a series of motions; predicting a speed of an edge of the immersion space relative to an edge of the object when the edge of the immersion space passes over the edge of the object during at least one motion of the series of motions of the route; comparing the speed to a predetermined parameter and to predict liquid loss from the immersion space during the at least one motion if the speed is greater than the predetermined parameter; and if liquid loss from the immersion space is predicted, modifying one or more parameters of the route during the at least one motion accordingly prior to executing the at least one motion.

In an embodiment, the predetermined parameter is a speed of an edge of the immersion space in a direction normal to the edge of the object above which liquid escapes from the liquid confinement structure when the edge of the immersion space passes over the edge of the object. In an embodiment, predicting the speed comprises treating the edge of the immersion space as a plurality of discrete immersion space edge portions and treating the edge of the object as a plurality of discrete object edge portions and calculating the speed for each immersion space edge portion. In an embodiment, the liquid confinement structure comprises a plurality of extraction openings in a surface facing the surface of the object and/or the support table, the extraction openings being for the extraction of immersion liquid from the immersion space and/or for the extraction of gas from outside of the immersion space, each of the plurality of discrete immersion space edge portions corresponding to one or more sequential extraction openings, and predicting the speed involves treating the discrete immersion space edge portions as portions extending between adjacent extraction openings. In an embodiment, modifying one or more parameters includes one or more selected from: reducing a speed of the at least one motion of the route; reducing the distance between the liquid confinement structure and support table during the at least one motion of the route; increasing a fluid flow rate into or out of the liquid confinement structure during the at least one motion of the route; and/or increasing a rate of change in direction of the support table during the at least one motion.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments have been described above, it will be appreciated that embodiments of the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. An immersion lithography apparatus comprising:
   a support table configured to support an object;
   a projection system configured to project a patterned beam onto the object;
   a positioner configured to move the support table relative to the projection system;
   a liquid confinement structure configured to at least partly confine a liquid to an immersion space between the projection system and a surface of the object and/or support table; and
   a controller configured to control the positioner to move the support table to follow a route comprised of a series of motions, the controller configured to at least:
      predict a relative speed between an edge of the immersion space and an edge of the object when the edge of the immersion space passes over the edge of the object occurring during at least one motion of the series of motions of the route;
      compare the speed to a predetermined parameter and predict liquid loss from the immersion space occurring during the at least one motion responsive to the speed being greater than the predetermined parameter; and
      responsive to a prediction of liquid loss from the immersion space, modify one or more parameters of the route for the at least one motion accordingly.

2. The immersion lithography apparatus of claim 1, wherein the controller is configured such that the prediction of the speed comprises treating of the edge of the immersion space as a plurality of discrete immersion space edge portions, treating of the edge of the object as a plurality of discrete object edge portions and calculating the speed for each immersion space edge portion.

3. A device manufacturing method using an immersion lithography apparatus to project a patterned beam onto a substrate, the method comprising:
   confining a liquid to an immersion space between a projection system and a facing surface of an object on a support table and/or of the support table, using a liquid confinement structure;
   moving the support table along a route comprising a series of motions;
   predicting a relative speed between an edge of the immersion space and an edge of the object when the edge of the immersion space passes over the edge of the object occurring during at least one motion of the series of motions of the route;
   comparing the speed to a predetermined parameter and predicting liquid loss from the immersion space occurring during the at least one motion responsive to the comparing determining that the speed is greater than the predetermined parameter; and
   responsive to the prediction of liquid loss from the immersion space, modifying one or more parameters of the route for the at least one motion accordingly prior to executing the at least one motion.

4. The method of claim 3, wherein the predetermined parameter is a relative speed between an edge of the immersion space and the edge of the object in a direction normal to the edge of the object above which liquid escapes from the liquid confinement structure when the edge of the immersion space passes over the edge of the object.

5. The method of claim 3, wherein predicting the speed comprises treating the edge of the immersion space as a plurality of discrete immersion space edge portions, treating the edge of the object as a plurality of discrete object edge portions and calculating the speed for each immersion space edge portion.

6. The method of claim 3, wherein the liquid confinement structure comprises a plurality of extraction openings in a surface facing the surface of the object and/or the support table, the extraction openings being for the extraction of immersion liquid from the immersion space and/or for the extraction of gas from outside of the immersion space, each of the plurality of discrete immersion space edge portions corresponding to one or more sequential extraction openings, and wherein predicting the speed involves treating the discrete immersion space edge portions as portions extending between adjacent extraction openings.

7. The method of claim 3, wherein modifying one or more parameters includes one or more selected from:
reducing a speed of the at least one motion of the route;
reducing a distance between the liquid confinement structure and support table for or during the at least one motion of the route;
increasing a fluid flow rate into or out of the liquid confinement structure for or during the at least one motion of the route; and/or
increasing a rate of change in direction of the support table for or during the at least one motion.

8. A non-transitory computer-readable medium comprising instructions therein, the instructions, upon execution by a computer system, configured to cause the computer system to at least:
predict a relative speed between an edge of an immersion space and an edge of an object when the edge of the immersion space passes over the edge of the object occurring during at least one motion of a series of motions of a route of movement of a support table, wherein the support table supports the object and wherein the immersion space is a space arranged to have liquid therein and is defined between a projection system of an immersion lithographic apparatus and a surface of the object and/or support table;
compare the speed to a predetermined parameter and predict liquid loss from the immersion space occurring during the at least one motion responsive to the speed being greater than the predetermined parameter; and
responsive to a prediction of liquid loss from the immersion space, modify one or more parameters of the route for the at least one motion accordingly.

9. The computer-readable medium of claim 8, wherein the instructions configured to predict the speed are further configured to treat the edge of the immersion space as a plurality of discrete immersion space edge portions, treat the edge of the object as a plurality of discrete object edge portions and calculate the speed for each immersion space edge portion.

10. The computer-readable medium of claim 9, wherein the instructions configured to predict the speed are further configured to determine that the edge of the immersion space passes over the edge of the object if one or both ends of one of the immersion space edge portions passes over an object edge portion during the at least one motion of the route.

11. The computer-readable medium of claim 9, wherein the instructions configured to predict the speed are further configured to determine a normal direction of at least one of the immersion space edge portions and a normal direction of the object edge portion over which the at least one of the immersion space edge portions passes, and calculate a relative velocity of the two normal directions due to the at least one motion of the route, wherein a magnitude of the relative velocity is taken as the speed.

12. The computer-readable medium of claim 9, wherein each of the plurality of discrete immersion space edge portions corresponds to one or more sequential extraction openings in a surface of a liquid confinement structure, the surface of the liquid confinement structure facing the surface of the object and/or the support table and the extraction openings are for the extraction of immersion liquid from the immersion space and/or for the extraction of gas from outside of the immersion space.

13. The computer-readable medium of claim 12, wherein the instructions configured to predict the speed are further configured to treat the discrete immersion space edge portions as portions extending between adjacent extraction openings.

14. The computer-readable medium of claim 8, wherein the instructions configured to predict the speed are further configured to determine the speed of a relative velocity between the edge of the immersion space and the edge of the object in a direction normal to the edge of the object occurring during the at least one motion.

15. The computer-readable medium of claim 8, wherein modification of one or more parameters includes one or more selected from:
reduction of a speed of the at least one motion of the route;
reduction of a distance between the liquid confinement structure and support table for or during the at least one motion of the route;
increase of a fluid flow rate into or out of the liquid confinement structure for or during the at least one motion of the route; and/or
increase of a rate of change in direction of the support table for or during the at least one motion.

16. The computer-readable medium of claim 15, wherein the instructions configured to modify one or more parameters are further configured to modify the one or more parameters such that the speed is reduced to the predetermined parameter or lower.

17. The computer-readable medium of claim 8, wherein the instructions configured to modify one or more parameters are further configured to modify the one or more parameters only if it is determined that it is appropriate to avoid or reduce the predicted liquid loss.

18. The computer-readable medium of claim 17, wherein the instructions are further configured to determine whether it is appropriate to avoid or reduce the predicted liquid loss by at least forecasting any movement of liquid from the liquid loss on the object during the route subsequent and/or prior to the at least one motion.

19. The computer-readable medium of claim 18, wherein the instructions are further configured to determine that it is appropriate to avoid or reduce the liquid loss if the forecast determines that liquid from the liquid loss remains on the object and/or support table at the end of the route at a position and/or in a quantity contrary to a predetermined set of rules.

20. The computer-readable medium of claim 17, wherein the instructions are further configured to determine whether it is appropriate to avoid or reduce the predicted liquid loss by at least forecasting the presence of liquid lost in the at least one motion in the path of the immersion space in a subsequent motion to the at least one motion.

* * * * *